(12) United States Patent
Ittel

(10) Patent No.: US 8,367,551 B2
(45) Date of Patent: Feb. 5, 2013

(54) SPIN-PRINTING OF ETCHANTS AND MODIFIERS

(75) Inventor: Steven Dale Ittel, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1262 days.

(21) Appl. No.: 11/388,670

(22) Filed: Mar. 23, 2006

(65) Prior Publication Data

US 2006/0264049 A1    Nov. 23, 2006

Related U.S. Application Data

(60) Provisional application No. 60/665,098, filed on Mar. 25, 2005.

(51) Int. Cl.
*H01L 21/302* (2006.01)
*H01L 21/461* (2006.01)

(52) U.S. Cl. .......... 438/689; 438/705; 438/745

(58) Field of Classification Search .......... 438/689, 438/705, 745
See application file for complete search history.

(56) References Cited

U.S. PATENT DOCUMENTS

| 2002/0129485 A1* | 9/2002 | Mok et al. ............... 29/527.2 |
| 2004/0038543 A1* | 2/2004 | Zahorik et al. .......... 438/705 |
| 2005/0089679 A1 | 4/2005 | Ittel et al. |
| 2005/0181206 A1* | 8/2005 | Endo et al. ............... 428/364 |

FOREIGN PATENT DOCUMENTS

BE    EP 1378948 A1 *  1/2004

* cited by examiner

*Primary Examiner* — Duy Deo
*Assistant Examiner* — Mahmoud Dahimene

(57) ABSTRACT

The present invention is directed to processes for printing compositions containing etchants or modifiers onto surfaces by spinning a filament from a viscoelastic polymer solution containing an etchant or modifier. The present invention also relates to viscoelastic compositions used in the printing processes, and devices made therefrom.

15 Claims, 1 Drawing Sheet

A process for the deposition of a spun filament containing etchant onto the surface layer of a substrate.

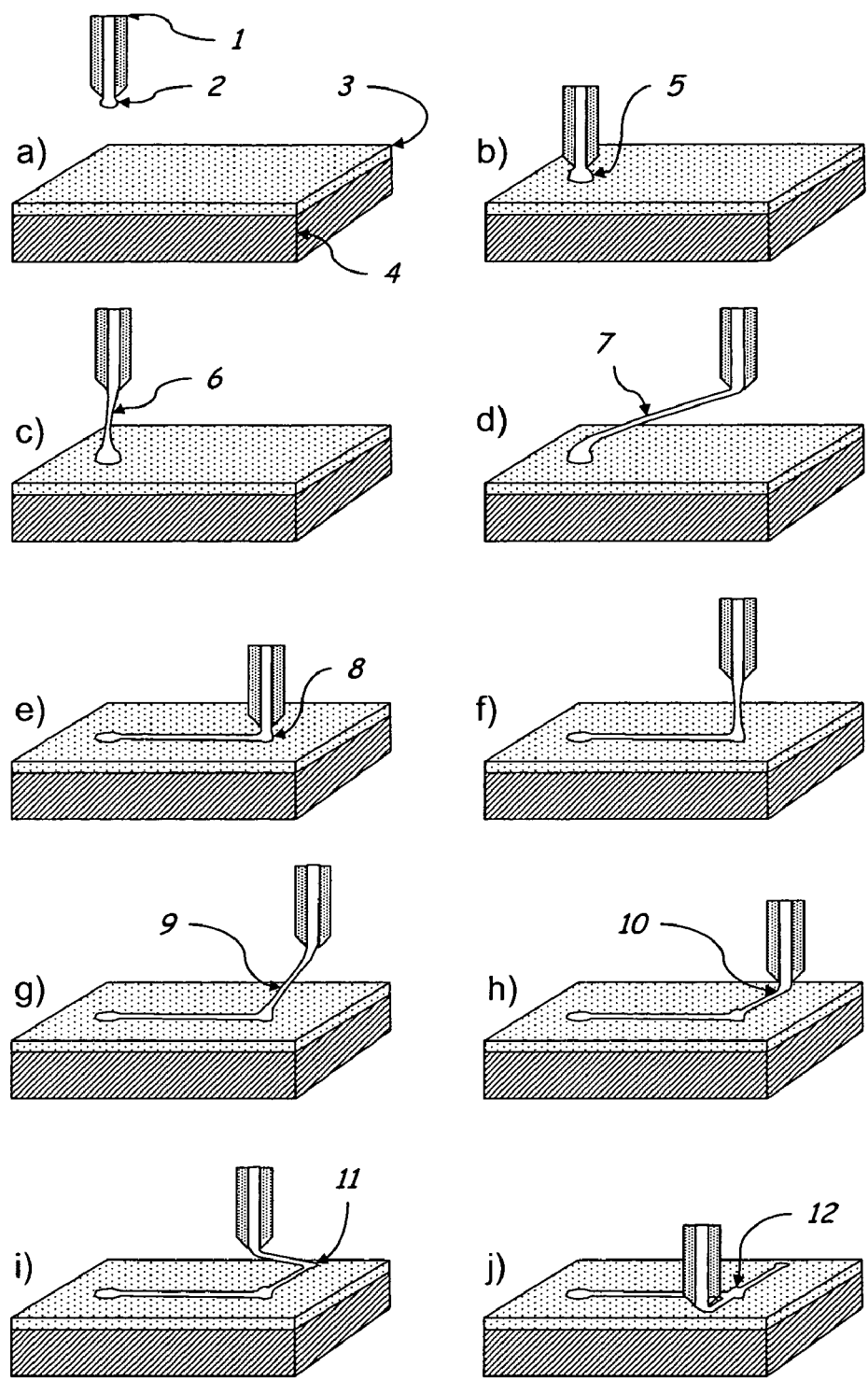
A process for the deposition of a spun filament containing etchant onto the surface layer of a substrate.

SPIN-PRINTING OF ETCHANTS AND MODIFIERS

This application claims the benefit of U.S. Provisional Application No. 60/665098, filed on Mar. 25, 2005.

FIELD OF THE INVENTION

The present invention is directed to processes for spin printing etchant or modifier materials for creating patterns and images, particularly for electronics and display applications. The present invention also relates to compositions used in the printing process and devices made using the processes.

TECHNICAL BACKGROUND

The electronics, display and energy industries rely on the formation of coatings and patterns of conductive and other electronically active materials to form circuits on organic and inorganic substrates. The primary methods for generating these patterns are screen printing for features larger than about 100 µm and thin film and etching methods for features smaller than about 100 µm. Other subtractive methods to attain fine feature sizes include the use of photo-patternable pastes and laser trimming.

It is the trend in the electronics industry to make smaller and less expensive electronic devices that provide higher resolution and enhanced display performance. As a result, it has become necessary to develop new materials and new approaches to manufacture such devices.

At times it will be preferable to coat an entire substrate with a surface layer and then, in a subtractive process, etch away the undesired portions of the surface layer to form the image. On the nano-scale, this is one of the fundamental underlying processes of the semiconductor industry. The technology is aggressive and well suited to small devices but there are many instances where the resolution of the semiconductor industry is not required. For example, in the photovoltaic industry, it is often required that long straight lines be selectively cut into devices. This is often done by laser scribing, which can be difficult when the layer to be removed is transparent and the layer below it to be left is opaque.

A technique to selectively etch portions of one layer while not damaging the subsequent underlayer is desirable for a wide variety of applications. This may be accomplished through the use of selective etchants that react chemically to remove one layer while leaving the next layer of differing composition undisturbed. The portions of the pattern to be retained are first covered with a resist. The etching process is carried out by exposing the entire area to the etchant. When the etching process is complete, the resist must be removed. A method that does not require the patterning and subsequent removal of a resist layer would be advantageous in certain applications.

Ink jet techniques allow the selective deposition of low viscosity, fluid materials onto a substrate surface. Because of the small droplet size of ink jet printing, it can be difficult to apply appreciable quantities of material, though this can be done utilizing multiple passes over the same area of an image. Appreciable drying time between passes may be required to prevent flowing of the image so that resolution is not compromised.

In solution spinning, a concentrated solution of a polymer is forced through a spinneret. The face of the spinneret is in contact only with a fluid, which is usually air. Because solvent evaporation is generally a slow process, after traveling a short distance through the air, typically 0.1-10 cm., the concentrated solution (in the form of a fine "jet") usually enters a coagulant, which extracts the solvent from the polymer, resulting in the formation of a polymer fiber. The coagulant is frequently water or, as in the case of the process disclosed herein, air. Importantly, in the gap between the spinneret face and the coagulant, the polymer solution, which is usually quite viscous and somewhat viscoelastic, is drawn, resulting in a smaller diameter jet of polymer solution entering the coagulant than was extruded from the spinneret holes. The amount of drawing that can be done is limited, because above some maximum draw value the fibers tend to break. This technique may be extended to processes for the selective deposition of materials as disclosed in US Patent application US2005/0089679 A1.

Despite the advances in such systems, the multiple, time-intensive steps required for current etching techniques employing resists are a limitation to manufacturing. Manufacturers are continuously seeking improved techniques and compositions that can fulfill their needs for selective materials removal. The techniques may be used in very specific applications if they provide greater speed and more specific materials removal. Such materials can increase the speed of the manufacturing processes without compromising high resolutions in the lines and spaces of the circuit or display patterns. The present invention is directed to such processes, materials and compositions suitable for implementation of the processes, and methods for production of the materials.

SUMMARY OF THE INVENTION

One aspect of the present invention is s composition comprising: from 1 to 70 percent by weight of at least one of an etchant or modifier; a dispersing vehicle, and from 0.1 to 8 percent by weight of an ultrahigh molecular weight polymer solution in the dispersing vehicle, based on the total weight of the composition, the ultrahigh molecular weight polymer and the dispersing vehicle both being chemically stable to the etchant or modifier.

Another aspect of the present invention is a process comprising:
a) forcing a deposit composition comprising from 0.1 to 50 percent by weight of at least one of an etchant or modifier, a dispersing vehicle, and from 0.1 to 8 percent by weight of an ultrahigh molecular weight polymer soluble in the dispersing vehicle, the ultrahigh molecular weight polymer and the dispersing vehicle both being chemically stable to the etchant or modifier, through an orifice to form a filament,
b) drawing the filament to a draw ratio between 2:1 and 100:1;
c) depositing the filament onto a surface layer on a substrate in an image-wise manner; and
d) allowing the etchant or modifier in the deposited filament to react with the surface layer on the substrate, thereby removing or otherwise modifying the physical properties of the surface layer in the desired image.

A further aspect of the present invention is a process comprising:
a) depositing from a dispensing orifice a reservoir of a deposit composition comprising from 0.1 to 50 percent by weight of at least one of an etchant or modifier, a dispersing vehicle, and from 0.1 to 8 percent by weight of an ultrahigh molecular weight polymer soluble in that dispersing vehicle, the ultrahigh molecular weight polymer and the dispersing vehicle both being chemically stable to the etchant or modifier, onto the surface of a substrate, such that said dispensing orifice and said substrate are simultaneously wet by the material in said reservoir;

b) pulling a filament from said reservoir by removing the dispensing orifice from the reservoir and translating the dispensing orifice in a direction away from the surface of said substrate to a location above a second point on said substrate at least 1 cm removed from the initial reservoir such that said filament extends between said reservoir and said location above that second point;

c) depositing that filament between said reservoir and said second point on the substrate by contacting the dispensing orifice to the substrate at said second point in an image-wise manner; and d) allowing the etchant or modifier in the deposited filament to react with the substrate surface, thereby removing or otherwise modifying the physical properties of the substrate surface in the desired image.

These and other aspects of the invention will be apparent to one skilled in the art in view of the following detailed description and the appended claims.

BRIEF DESCRIPTION OF THE DRAWINGS

FIG. 1 shows a process, according to one embodiment of the invention, for the deposition of a spun filament containing etchant onto the surface layer of a substrate.

DETAILED DESCRIPTION

In one embodiment of the present invention, a composition contains an extensible solution of a relatively dilute, ultrahigh molecular weight polymer. It is desirable to utilize the lowest possible solution concentration of the ultrahigh molecular weight polymer in the dispersing vehicle while maintaining the ability to spin the composition. The composition also contains an etchant that can remove material from a surface layer deposited on a substrate material on which the etching composition is deposited. Alternatively, instead of the etchant, the composition contains a modifier that can transform the physical properties of a surface layer on a substrate surface on which the modifying composition is deposited. Optionally, the composition can contain a variety of other materials that aid in the formulation of the composition, the printing of the composition, and/or the performance of the composition in end use applications.

Lines of the composition can be printed onto a substrate by a spin printing process, which forces the composition through an orifice to form a continuous filament that is stretched (drawn) while being laid down onto the substrate surface in an image-wise manner. The term "image-wise", as used herein, means that a filament is moved or deposited on a substrate surface in such a way as to form an image on the surface. Similarly, the term "pattern-wise" is used herein, and may be used interchangeably with the term "image-wise", to indicate that the filament is moved in such a way as to form a particular pattern. In general the substrates being etched or modified will be thin layers of one material coated on another—for instance a one micron layer of aluminum on a glass surface. The etchant formulations are allowed to react with the surface to remove the thin layer of material from that surface and the surface of the substrate may then optionally be washed to remove the etchant and its reaction products. The modifier formulations are allowed to react with the thin layer of material on the surface of the substrate to modify some specific physical property of the surface layer while leaving it largely intact and then the surface of the substrate may then optionally be washed to remove the modifier and its reaction products.

Optionally, it may be desirable to heat treat the substrate and etchant after application of the etchant composition to accelerate any chemical reaction that is taking place. This heat treatment may be accomplished by any of a variety of methods, such as carrying out the printing process on a heated table, passing the printed object though a heated zone, applying infrared radiation from above the substrate, or applying selective laser heating to the object in the desired location.

A "substrate" is a solid material on which a "surface layer" may be formed. The substrate does not react with the etchants or modifiers described herein, but rather, provides a physical support for the thin surface layer. Typical substrates are glass, ceramic, or plastic. The substrate may also be metal providing that the metal is inert to the etchants or modifiers.

A "surface layer" is a layer of material coating the surface of a substrate that is subject to the action of the etchant or modifiers described herein. The surface layer may be deposited on the surface of the substrate by vapor deposition, sputtering, ink-jet printing or other printing techniques, electroplating or electroless plating, painting or a variety of other techniques. The surface layer may also be formed by chemical reaction of the substrate. For instance, there may be a surface layer of alumina on an aluminum surface due to oxidation, or the surface of aluminum may be anodized. In general the surface layer will be from 0.01 to 10 μm in thickness with 0.1 to 2 μm being more typical.

Typical combinations of surface coatings and substrates include the following: indium tin oxide (ITO) on polyester plastic, aluminum on glass, silver on ceramic, copper on ceramic, nickel on glass, or ITO on silicon. Other examples include Kapton® polyimide on copper, polyester on copper, or polythiophene on Kapton®.polyimide wherein, the etchant would be removing a polymeric layer that had been coated onto a substrate. In a more specific example, a complex copper pattern on a substrate may be coated with a layer of insulating Kapton® polyimide. The Kapton® polyimide insulator may then be removed in selective locations to provide vias for electrical contact from the top to the bottom of the Kapton® polyimide layer.

When an amount, concentration, or other value or parameter is recited herein as either a range, preferred range or a list of upper preferable values and lower preferable values, the recited amount, concentration, or other value or parameter is intended to include all ranges formed from any pair of any upper range limit or preferred value and any lower range limit or preferred value, regardless of whether such ranges are separately disclosed. Where a range of numerical values is recited herein, unless otherwise stated, the range is intended to include the endpoints thereof, and all integers and fractions within the range. It is not intended that the scope of the processes and compositions disclosed herein be limited to the specific values recited when defining a range.

As the solution-spun filament exits the spinneret, it can be subjected to a drawing procedure. For the purpose of the processes disclosed herein, draw or draw ratio is defined as the ratio of the printing speed to the speed at which the filament initially exits the spinnerette. The printing speed is the rate of relative motion between the printing spinnerette and the substrate. Thus if the filament is extruded from the spinnerette at a rate of 1 m/min and the substrate is being translated at a speed of 10 m/min, then the draw ratio is 10. The elongation of the filament that occurs when the filament is extruded is referred to as drawing.

During the drawing procedure the solution spun filament is drawn to a total draw ratio of at least about 2:1 to 100:1. The total draw ratio will typically be within the range of about 5:1 to about 20:1 for circular filaments. It is advantageous to utilize drawing to decrease line size, and increase uniformity. Drawing of non-circular filament shapes should be minimal because there is a tendency of all shapes to approach circular upon drawing and the desired advantage of the shaped filament will be lost if drawing it too great.

An "etchant" is a solution for chemical reaction that can be used to remove a thin layer of material from a substrate surface in a pattern-wise manner to reveal macro- or microstructures. A selective etchant reacts with the outermost layer of material to remove it substantially completely while leaving subsequent layers untouched. More commonly, a thin layer of metal coated onto a surface by evaporation sputtering or chemical vapor deposition is masked to protect those portions not to be removed and then the etchant can be applied to the entire surface to remove only the exposed portions.

In contrast to normal etching procedures where a pattern is masked and the etchant is applied to the entire surface, the processes disclosed herein does not require masking and the etchant is applied only to those portions of the pattern where removal is desired. Nonetheless, for some particularly complex patterns, it may be desirable to mask some portions of the substrate yet still take advantage of the desirable attributes of the spin printing process.

Etchants are well known in the industry. A listing of etchant systems for metals on glass, ceramic or polymeric surfaces listed by metal to be etched includes:

Aluminum
1. "metal etch" (3:3:1:1 $H_3PO_4$:$HNO_3$:$CH_3COOH$:$H_2O$)
2. "Al fine line etch 1" (4:1:4:1 $H_3PO_4$:$HNO_3$:$CH_3COOH$:$H_2O$)
3. "Al fine line etch 2" (1:2 HCl:$H_2O$)
4. "Al fast etch" (17:1:3 $H_3PO_4$:$HNO_3$:$CH_3COOH$:$H_2O$)
5. Copper based (5:20:75 CuCl:$NH_4Cl$:$H_2O$)
6. Oxalic acid (8:92 $H_2C_2O_4$:$H_2O$)

Antimony
1. "metal etch" (3:3:1:1 $H_3PO_4$:$HNO_3$:$CH_3COOH$:$H_2O$)

Chromium
1. "Cr acid etch" (1:1 HCl:glycerine)
2. "Cr base etch" (1:3 [50 g NaOH+100 ml $H_2O$]:[30 g $K_3Fe(CN)_6$+100 ml $H_2O$])

Gold
1. "Aqua Regia" (3:1 HCl:$HNO_3$)
2. "Au mask etch" (4:1:40 KI:$I_2$:$H_2O$)

Copper
1. "Persulfate" 15:100 Sodium persulfate:$H_2O$~20 s/micron@ 45 C When free of Fe, this solution is selective for Cu against Ni (added iron salts will cause Ni corrosion)

Nickel
1. "metal etch" (3:3:1:1 $H_3PO_4$:$HNO_3$:$CH_3COOH$:$H_2O$)

Silver
1. "dilute metal etch" (3:3:23:1 $H_3PO_4$:$HNO_3$:$CH_3COOH$:$H_2O$)
2. "silver base etch" (1:1:4 $NH_4OH$:$H_2O_2$:$CH_3OH$) 0.36 micron/min
3. Copper based (5:20:75 CuCl:$NH_4Cl$:$H_2O$)
4. KI etch 4:1:40 KI:$I_2$:$H_2O$
5. Basic peroxide 10:10:40 $NH_4OH$:$H_2O_2$:MeOH
6. Ferric etch (2:8 $Fe(NO_3)_3$:$H_2O$, heated to about 40° C.
7. Sulfamic acid (1:9 $H_2NHSO_3$:$H_2O$ Titanium
1. Titanium etch 2 (1:9 HF:$H_2O$)
2. Saturated oxalic acid in water In the above listing most of the etchants are strong acid systems. Those that are not include those that are basic(Cr2, Ag2,5) and those that rely upon redox or chelation chemistry to accomplish the etching process (Al5,6, Au2, Cu1, Ag3,4, 6,7, Ti2). In addition to these materials, it may be desirable to etch other materials. Aqueous HCl will etch indium tin oxide. Aqueous HF will etch silica, titanium and other early transition metals. Both are strong acids. Strong base will etch glass, aluminum, or other metal oxides. Appropriate etchants for various materials can be selected by one skilled in the art.

Complete etching of the thin layer metal layer on the surface of the substrate will eliminate the metallic conductivity of the surface. If elimination of metallic conductivity is all that is required, any resulting residue may be left in place. For most applications, however, the residue is removed by washing. The above examples of etchant compositions can be modified for spin printing by the addition of water-soluble ultrahigh molecular weight polymeric materials to the water-based compositions. One skilled in the art will recognize that with relatively concentrated nitric acid compositions, the nitric acid can react violently with some organic polymers.

Spin printing heads (alternatively called spinnerets) are not necessarily designed for use with aggressive materials such as some etchants. One skilled in the art will recognize that spin printing heads of some materials will be more durable than others and may be more desirable depending upon the etchant used. For example, ceramic materials are particularly well suited for acid-etchants, but are sometimes attacked by base. Metals are resistant to base but may be attacked by acids.

As an alternative to etching, a "modifier" can be used. A modifier is a chemical that can transform the physical properties of a thin layer on a substrate layer from one form to another. These can include the modification with regard to color or lack thereof, or modification of electrical or thermal conductivity, dielectric constant, emissivity, fluorescence, phosphorescence, etc. For example, a portion of a conductive metal layer can be transformed to a metal oxide or sulfide layer, which will render that portion of the layer non-conductive. Thin layers of indium tin oxide (ITO) are utilized as transparent conductors in electronics applications, but by changing the doping of an ITO layer, the conductivity or optical transparency of that layer can be modified. A transparent layer can be transformed into a colored or even black layer to prevent the transmission of light. Laser trimming of the impedance of capacitor dielectric layers can be modified by chemically modifying the dielectric constant of the active layer. Luminescent or phosphorescent layers can be quenched with optical quenchers. For purposes of classification, a major difference between and etchant and a modifier is that modifiers are typically left in place and etchants are generally removed from the surface of the substrate. For instance, base treatment of an aluminum surface will result in the transformation of the aluminum to alumina. If the alumina is left in place on the substrate, then the base might be considered to be a modifier, but if the surface is then washed to remove the alumina, then the transformation might more properly be described as etching. Classification of a material as a modifier or etchant is not critical, and the two types of materials can be used interchangeably in the compositions and processes disclosed herein.

An "enhancing polymer" is an added polymer that can be included to improve any aspect of a process or material. For example, the enhancing polymer can increase the viscosity of the etching solution so that it does not spread out on the surface of the substrate. An enhancing polymer may be added to allow better drying behavior of the printed etchant or modifier. An enhancing polymer may be a sequestering agent designed to solubilize the metal ions produced during the etching process.

A "sequestering agent" is a material added to promote etching by removal of the byproducts of the etching process. Sequestering agents are particularly helpful when the solvent chosen is not a good solvent for the resulting products of the etching process. Sequestering agents can include zeolites and related species if they are solids, and complex multidentate ligands if allowed to remain in solution. For example, the family of compounds known as siderophores can be used as sequestering agents, due to their relatively high affinity for iron.

Generally, any ultrahigh molecular weight polymer can be used in a solvent in which it is soluble to a concentration in excess of the concentration to be employed in the formulation, though some are more practical than others. It is known to those skilled in the art that the selection of possible solvent/polymer combinations is limited. The ultrahigh molecular weight polymer in solution imparts significant viscoelasticity to the solution, making the solution extensible even at very low concentrations of the polymer. Similar effects can be seen for more concentrated solutions of polymers that are merely high but not ultrahigh in molecular weight. Such systems are less effective in this application because significantly higher concentrations of polymer are required to maintain sufficient viscoelasticity to spin-print continuous filaments without breakage. The ratio of etchant to polymer will be decreased and the higher concentrations of polymer will leave higher levels of residue on the substrate. In a viscoelastic polymeric fluid, there are normal (elastic) forces generated during shear in addition to the viscous forces. Since normal-forces scale with weight average molecular weight (Mw) to the 7th power, as compared to viscous forces that scale to Mw to the 3.4 power, as the molecular weight of the polymer builds, the normal forces scale very quickly.

The term "ultrahigh molecular weight polymer", as used herein, refers to a polymer having a molecular weight over 1,000,000. The term includes single homopolymers and copolymers and mixtures of homopolymers and/or copolymers. Useful polymers for aqueous solutions include, but are not limited to poly(ethylene oxide), poly(acrylamide), DAPS® 10 [acrylamide-3-(2-acrylamido-2-methylpropyl) dimethylammonio)-1-propanesulfonate copolymer], and polyvinylpyrrolidone. Some examples of biologically-derived materials that can be used are guar gum, locust bean gum, carrageenan or Irish moss, gum karaya, hydroxyethyl cellulose, and sodium carboxymethylcellulose. Poly(ethylene oxide) and poly(acrylamide) are preferred polymers, and poly(ethylene oxide) is especially preferred. Included in the term poly(ethylene oxide) are both homo- and copolymers of ethylene oxide. Similarly, the term poly(acrylamide) is meant to include homopolymers of acrylamide as well as its copolymers with monomers such as acrylic acid or N-alkylacrylamides.

The concentration by weight of the polymer in the composition is about 0.1-8% by weight, preferably about 0.5-5%, and more preferably about 1-2%, based upon the total weight of all of the components in the composition. The optimum concentration depends on factors such as the molecular weight of the polymer being used and its chemical structure and can be determined by one skilled in the art. Generally, the higher the molecular weight of the polymer, the lower the concentration needed in the extensible viscoelastic solution. Some polymers for the extensible solutions, particularly natural polymers, may have some fraction that is insoluble in water. The insoluble fraction is preferably removed, e.g., by filtration of the solution. It is desirable to avoid reduction of the molecular weight of the polymer in solution during such removal.

Useful polymers for hydrocarbon solutions include, but are not limited to poly(alpha-olefins) wherein the olefins contain eight or more carbon atoms. For example, polyoctene, polydecene, polydodecene, polytetradecene, polyhexadecene, polyoctadecene, polyeicosene, and higher, and copolymers of mixed alpha-olefins such as polyhexene/codecene, polypentene/cohexadecene, polyhexene/cooctenne/codecene, and related copolymers are effective. These polymers dissolved in hexane, octane, methylcyclohexane, decane, decaline, petroleum ethers, purified kerosenes, Exxon's Isopar® high purity isoparafinic solvents, or other hydrocarbon solvents are suitable non-aqueous systems for spin printing. They can be quite effective in use, but in practical terms, may suffer from the flammability of the solvent. Hydrocarbons may not be ideal for use in reactions involving highly polar molecules such as inorganic acids and other typical etchant systems. Nonetheless, they can be solvents for a variety of longer-chain acids and there are a variety of sequestering or chelating agents suitable for hydrocarbon systems. Thus they can be utilized for etching. They are also suited to solubilizing longer-chain thio compounds or other molecules useful as modifiers rather than etchants.

Acrylic polymers such as those based upon methacrylates, acrylates, styrene and other monomers that will randomly copolymerize with these monomers, when of sufficient molecular weight, are useful in solvents such as pyridine, butyl acetate, butyl cellosolve acetate; carbitol esters, such as butyl carbitol, butyl carbitol acetate and carbitol acetate, TEXANOL-B® (2,2,4-trimethyl-1,3-pentanediol monoisobutyrate) and other appropriate polar and generally, ester solvents.

If polymers such as polyesters or nylons are to be employed, solvents such as hexafluoroisopropanol, phenol, catechols or formic acid are preferred. Because such solvents can be toxic and noxious, their use may not be preferred for some applications. An ultra-high molecular weight PET suitable for use in the processes disclosed herein can be made using known methods, including for example, the procedure disclosed by Rinehart in U.S. Pat. No. 4,755,587 or the process disclosed by Cohn in U.S. Pat. No. 4,792,573. In an example of a spin printing process, a solution of PET in an appropriate organic solvent is prepared with the PET essentially homogeneously dispersed throughout the solvent. Preferred organic solvents for PET include (a) hexafluoroisopropanol, (b) trifluoroacetic acid, (c) mixed solvent systems containing hexafluoroisopropanol and dichloromethane, and (d) mixed solvent systems containing trifluoroacetic acid and dichloromethane. Mixed solvent systems of hexafluoroisopropanol and dichloromethane typically contain from about 20 weight percent to about 99 weight percent hexafluoroisopropanol and from about 1 weight percent to about 80 weight percent dichloromethane. Such hexafluoroisopropanol/dichloromethane mixed solvent systems preferably contain from about 30 weight percent to about 99 weight percent hexafluoroisopropanol and from about 1 weight percent to about 70 weight percent dichloromethane. Mixed solvent systems containing trifluoroacetic acid and dichloromethane typically contain from about 20 weight percent to about 99 weight percent trifluoroacetic acid and from about 1 weight percent to about 80 weight percent dichloromethane.

The term "dispersing vehicle", as used herein, refers to fluids that are solvents or mixtures of solvents for the ultra-high molecular weight polymer and are compatible with the etchants and/or modifiers. Mixed solvents can be used. For example, it may be useful to combine water with an alcohol or glycol to modify the rate of evaporation of the overall solvent mixture. Similarly, butyl acetate solvent can be used in conjunction with 2,2,4-trimethyl-1,3-pentanediol monoisobutyrate to modify the rate of evaporation.

Solvent(s) for use in the processes disclosed herein desirably have sufficiently high volatility to enable the solvent to be evaporated from the dispersion by the application of relatively low levels of heat at atmospheric pressure; however, it is preferred that the solvent not be so volatile that the ink rapidly dries at normal room temperatures, during the spin-printing process. Preferred solvents for use in the compositions have boiling points at atmospheric pressure of less than 300° C. and preferably less than 250° C. For more polar polymer systems, such solvents include water, aliphatic alcohols, esters of such alcohols, for example, acetates and propionates; terpenes such as pine oil and alpha- or beta-terpineol, and mixtures thereof; ethylene glycol and esters thereof, such as ethylene glycol monobutyl ether and butyl cellosolve acetate; carbitol esters, such as butyl carbitol, butyl carbitol acetate and carbitol acetate and other appropriate solvents such as Texanol-B® (2,2,4-trimethyl-,3-pentanediol monoisobutyrate). When using these organic solvents, the chemical reactivity of the etchants is a factor in handling. Strong oxidants and acids may react violently with some of these organic materials so working combinations are desirably prepared with due consideration of safety.

Beyond the issue of safety, it is desired the ultrahigh molecular weight polymer solution be "stable" to the etchant. This is a relative term, but in practice, what it means is that the molecular weight of the polymer and the resulting viscoelasticity does not change substantially during the time of printing. Thus it is observed that the printability of some of the polymer compositions disclosed herein can exhibit a decline in performance in a matter of days or even hours. For printing performance, it is highly preferred that the inks be prepared as close to the time they are to be used in printing as possible, or even more preferably, continuously during printing. For example, the solution of the ultrahigh molecular weight polymer can prepared separately from the etchant and the two components combined in-line just before spin printing.

As discussed above, the primary solvents are chosen in tandem with the ultrahigh molecular weight polymer. Water is highly preferred for use with some polymers because it is compatible with many polymers and it is non-flammable as opposed to the solvents for the polyolefin systems. Water is desirably used in combination with a variety of hydrophilic organic solvents to modify the rate of evaporation, the wetting of the substrate, the compatibility with other additives. Water, as used herein, includes mixtures and combinations in which the major component (e.g., about 80 weight/volume percent or more) of the dispersing vehicle is water.

The ability to utilize mixtures of solvents with the processes disclosed herein provides considerable process advantages through operating latitude. Multiple solvents chosen to have specific evaporation or volatilization profiles can be critical in the development of uniform lines and edges, and in assuring adhesion of the printing ink to the substrate surface. In a preferred process, the primary solvent is water used in combination with other organic solvents having varied volatilities.

It is desirable that the vapor pressure of the organic molecules present in the dispersing vehicle be sufficiently low that the dispersing vehicle does not evaporate too rapidly from the printed pattern at room temperature. It is desirable that the solvent remain for seconds or even minutes after the printing process. Another issue with too rapid drying is that the printed filament may break or may not adhere to the substrate if it has dried significantly during the printing process.

The polymers impart significant viscoelasticity for spinning and in the presence of any solids, suspend those solids in the solvent so that they can be conveniently spun and applied to the substrate. Furthermore, the solvent diffuses from the spinning composition and volatilizes during heat treatment to provide a substantially liquid-free, etchant or modifier in combination with the polymeric components.

It is generally desirable to wash the substrate after etching to remove the residues of the etching process. However, when the substrate has been modified rather than etched, washing may not be necessary. In some applications, any excess materials can be removed by volatilization or even burning out. It is desirable that the polymeric components are eliminated during firing in such a way as to provide an image that is substantially free of voids and defects. The polymers when burned out act as "fugitive polymers" that undergo 98-100% burnout under the firing conditions. The polymers are referred to as a "fugitive polymers" because the polymer material can be removed from the surface of the substrate after the etching or modification process is complete. As opposed to the solvent components that are simply volatilized, the polymeric components generally undergo decomposition or oxidation during removal. Thus, an important factor in the choice of both the ultrahigh molecular weight components and the dispersant component is their thermal behavior as indicated by thermogravimetric analysis. In general, it is desired that the polymers leave behind no carbonaceous residue, thus aromatic polymers are generally not preferred. For example, ultrahigh molecular weight polymers or enhancing polymers containing a significant proportion of aromatic hydrocarbons, such as phenolic resin materials, can leave graphitic carbon particles on the surface of the substrate during firing, which can require significantly higher temperatures for complete removal. It is also desirable that the polymeric components do not melt or otherwise become fluid during the firing process, to avoid degradation of the printed image.

In some compositions it is advantageous to include "enhancing polymers" in addition to the ultrahigh molecular weight polymers. The purpose of the enhancing polymers is to modify the viscosity and surface properties of the etchant or modifier solution while the etchant or modifier solution is on the surface of the substrate. One result is the minimization of the spread of the etchant line to provide more narrow features. The weight average molecular weight of the "enhancing polymer" binder is preferably from about 2,000 to about 100,000, dependent upon the application. Weights less than 10,000 are generally useful because they do not adversely affect the viscosity of the composition. It is desired that the viscoelastic properties of the composition be imparted mostly by the ultrahigh molecular weight polymer.

As used herein, the term "deposit composition" refers to a composition when it has been or is about to be deposited on the surface of a substrate.

In a preferred method, a reservoir of the spin printing composition is touched to the surface of the substrate to deposit a reservoir of material which is then pulled as en elongated filament from the surface and laid across the substrate to a new location. This is generally done through a dispensing orifice. For the purpose of this invention, a dispensing orifice is defined as a spinnerette or other device through which the composition can be forced, but which includes some mechanism for interrupting the flow of the printing composition. Thus if it were a simple spinnerette, the pressure to the spinnerette could be interrupted. Alternatively, an on/off valve or a diverting valve can be built into the spin printing device such that the flow could be controlled. In general, it is desired that both the inside and outside diameters of the dispensing orifice be relatively small so as to minimize smearing during the printing process. Typical inside diameters of spinnerettes and dispensing orifices are between 10 and 350 micrometers.

As used herein, "reservoir" means a quantity of material deposited onto the surface of the substrate by the dispensing orifice without drawing but from which one or more filaments could be drawn in one or more directions. The purpose of the initial reservoir is to wet the surface of the substrate to provide a point of attachment to the substrate from which those one or more filaments could be drawn. If the filament is to be drawn a short distance, the reservoir may contain all of the material required. If the point of attachment to the surface of the substrate is to be some distance from the initial reservoir, the dispensing orifice may be required to eject additional spin printing composition during the drawing process.

Alternatively, the reservoir can be deposited on the surface of the substrate from a depositing orifice such as a spinneret and the drawing of a filament from the reservoir can be accomplished with another object. A finely pointed object such as a needle can be advantageously used as a drawing object.

The length of the filament to be drawn is limited in part by the amount of material contained in the reservoir on the surface of the substrate. When the drawing object is capable of delivering additional deposit composition during the drawing process, as in a spinneret, the length can be extended.

A process of spin printing utilizing a deposit composition is further illustrated in FIG. 1. In that figure, 1 is the spinnerette or dispensing orifice and 2 is the etchant composition. The surface layer to be etched, 3, is supported on the substrate 4. In FIG. 1a), the dispensing orifice is above the surface with a small quantity of etchant composition, 2, extending from the spinnerette, 1. In FIG. 1b), the dispensing orifice is lowered and the etchant composition touches the surface layer leaving a reservoir of the deposit composition, 5. In FIG. 1c), The dispensing orifice is quickly raised, pulling a filament, 6, of etchant composition from the reservoir, and quickly translated to a second point above the surface (to the right in FIG. 1d) providing a drawn filament, 7, of etchant composition between the two points, Lowering the spinnerette (FIG. 1e) pins the filament to the surface with another deposit reservoir, 8, and a line of etchant between points 5 and 8. At this point the spinnerette could be removed disconnecting the filament, or as shown in FIGS. 1f) and 1g), it can be raised and translated to a new position (this time the movement is illustrated to the back) generating a new filament of etchant, 9, which is then contacted with the surface layer of the substrate. In FIG. 1h), the filament is pinned to the back of the substrate at 10, creating a new deposit reservoir, 11. It is then re-elevated (in FIG. 1i) and moved to the front, past the existing line (5→8)to generate a "T" intersection, 12, as shown in the final 1j). The procedure may be continued at will. Generating as many deposit reservoirs as required to complete the desired pattern. It would also be possible to detach from any of the pinning points and return to the initial deposit reservoir, 5 to start a new filament in a new direction, but this would have to be done quickly because the solvents are drying in that initial deposit reservoir while the operation is being continued elsewhere and if the composition of the etchant has changed appreciably due to that drying process, a new deposit reservoir may be required.

It should also be noted that the description above includes one section (between points 8 and 10) where the etchant composition has been applied twice. If the surface layer is thick or the concentration of the etchant is not sufficient, this repeated application increases the quantity of etchant available. While a repeated application requires additional time, it is possible to print thinner lines and then supply additional etchant to that same line to etch more narrow features.

Generally, spin printing processes, by the nature of spinning and drawing filaments, are best suited to printing long, straight, uniform lines on a flat substrate. The process of introducing physical contact of the spinneret with the substrate, thereby pinning the filament to the substrate, allows the filament to be drawn in different shapes, e.g., having corners or curves. Thus a right angle pattern can be printed by translating in the X direction over a substrate, touching the surface at a specified point and then translating in the Y direction.

Spin printing readily accommodates printing on flat surfaces. Convex surfaces are readily treated through three-dimensional movement of the spinneret with respect to the surface of the substrate. However, spin printing may not normally accommodate printing on concave surfaces because the linear drawing of the filament is likely to span gaps in the surface. Contacting the surface of the substrate to leave a reservoir at the point of contact facilitates the printing of concave three-dimensional surfaces.

Additional components known to those skilled in the art can be present in the printing composition, including dispersants, stabilizers, release, agents, dispersing agents, stripping agents, and/or antifoaming agents. Examples of suitable additional components include those disclosed in U.S. Pat. No. 5,049,480.

The processes disclosed herein can be applied to printing a wide variety of materials on a wide variety of substrates. The types of substrates that are particularly useful include polyfluorinated compounds, polyimides, epoxies (including glass-filled epoxy), polycarbonates, polyester, polyethylene, polypropylene, polyvinyl chloride, acrylonitrile, butadiene (ABS), metallic foil, ceramics and glass. The substrate will usually be coated, for example a thin dielectric coating can be on a metallic foil or a metal film on a ceramic or glass.

One difficulty in printing fine features is that the printed composition can wet the surface and rapidly spread to increase the width of the deposit, thereby negating the advantages of fine line printing. This is particularly true when printing is employed to generate fine features such as interconnects or conductors for displays.

Spreading of the etching or modifying composition is influenced by a number of factors. A drop of liquid placed onto a surface will either spread or not depending on the surface tension of the liquid, the surface tension of the solid and the interfacial tension between the solid and the liquid. If the contact angle is greater than 90 degrees, the liquid is considered non-wetting and the liquid tends to bead or shrink away from the surface. For contact angles less than 90 degrees, the liquid can spread on the surface. For the liquid to completely wet, the contact angle must be zero. For spreading to occur, the surface tension of the liquid must be lower than the surface tension of the solid on which it resides.

The compositions can be confined on the substrate, thereby enabling the formation of features having a small minimum feature size, the minimum feature size being the smallest dimension in the x-y axis, such as the width of a conductive line. For example, the composition can be confined to regions having a width of not greater than 100 μm, preferably not greater than 75 μm, more preferably not greater than 50 μm, and even more preferably not greater than 25 μm. The present invention provides compositions and methods of processing that advantageously reduce the spreading of the compositions. For example, small amounts of rheology modifiers such as styrene allyl alcohol (SAA) and other polymers can be added to the printing composition to reduce spreading. The spreading can also be controlled through combinations of nanoparticles and precursors. Spreading can also be controlled by rapidly drying the compositions during printing by irradiating the composition during deposition.

A preferred method is to pattern an otherwise wetting substrate with non-wetting enhancement agents that control the spreading. For example, this can be achieved by functionalizing the substrate surface with trialkylsilyl, hydrocarbyl or fluorocarbon groups. In an extreme, this could be considered to be masking and would be particularly appropriate when it is desired to etch or modify complex patterns. For example, long straight etch lines could be interrupted by printing a mask perpendicular to the line direction.

Another example of a method for depositing the composition is to heat the composition to a temperature higher than that of the substrate to decrease the viscosity of the composition during printing. Generally the temperature difference between the composition and the substrate will be at least 10° C. before there is any noticeable effect of the heating. This can also have the advantage of volatilizing a portion of the dispersing vehicle before the etching or modifying composition reaches the substrate, thereby minimizing spreading of the line due to wetting of the surface. On the other hand, it is possible to volatilize the solvents too rapidly. Thus, it may be desirable to employ two or more solvents having significantly differing volatilities so that one is more quickly volatilized while another remains.

Another example of a method for depositing the composition is to employ an array of spinnerets. Thus, for example, to etch or modify 100 parallel lines on silicon for a photovoltaic cell, a spinning head containing 100 spinnerets would be used. Consecutive substrates can be transported continuously beneath the spinning head to print all 100 lines on each glass panel with no break in the etchant-containing filament. Alternatively, a single head can be transported repeatedly back and forth across a single substrate printing all 100 lines consecutively.

Another example of a method for depositing the composition is by creating a reservoir and pulling filaments from that reservoir. Generally, a filament being stretched will be substantially linear from the point from which it originated to the point at which the drawing force is being applied. Thus, curved patterns are difficult. However, the act of "pinning" the filament to the substrate surface by touching it to that surface such that it adheres allows the direction of draw to be changed to create, for example, a right angle in the resulting image. This process may be repeated as many times as necessary to create the desired image. Taken to an extreme, the spinneret would be writing continuous curves on the surface of the substrate; there would be no draw of the filament and the width of the resulting line would be determined by the diameter of the spinneret. The resolution of the lines can, however, be severely limited when the filament is not drawn and the width of the resulting line is not controlled.

Another method for depositing the etching composition is to employ multi-pass deposition of the etchant to increase the depth of the etching reaction. A single layer can be deposited and allowed to react, followed by repetitions of this cycle. Sequential layers of etchant material do not have to be taken through sequential drying processes; additional depositions may be carried out before the previous layer is completely reacted. It is likely that the initial etching process will promote the wetting of subsequent layers of etchant. The use of multiple layers can be employed to etch substantial channels or vias on the surface of a substrate.

It will be appreciated from the foregoing discussion that the processes disclosed herein are particularly suitable for the etching or modification of straight lines on a substrate. The width of line features is determined by a variety of factors, including the width of the etchant-containing filament being deposited upon the surface, the size of the spinneret, the pumping rate through the spinneret, and the draw ratio of the filament after it has left the spinneret and before it has contacted the substrate surface. The draw ratio of the filament is a function of the rate of translation of the spinneret relative to the surface of the substrate. Relative translation of the spinneret to the substrate can be accomplished by movement of either the substrate or the spinneret. The width of a line may be modulated by modification of width of the filament before contact with the substrate. Thus the width of a line may be modulated, for example, by changing the spinning rate or by changing the rate of relative translation of the spinneret to the substrate.

The width of line features is also a function of the concentration of the dispersing vehicle at the moment of contact with the substrate surface. Thus, if there is evaporation of the dispersing vehicle from the filament between the time that it exits the spinneret and the time that it contacts the surface of the substrate, wetting of the surface and spreading of the line is reduced and the etchant or modifying reagent becomes concentrated. This is particularly true as the diameter if the drawn filament is reduced, thereby increasing the relative surface area of the filament from which evaporation may occur. On the rapid time frame of the printing process, evaporation will occur primarily from the surface of the filament rather than uniformly throughout. This further contributes to minimization of spreading on the substrate surface.

When forcing the etching or modifying composition through the spinneret, a variety of methods may be employed. A positive displacement pump may be employed to maintain a constant flow rate. Syringe pumps are typically employed for this approach. Alternatively, the composition may be maintained at a constant positive pressure sufficient to force it through the spinneret at the desired rate.

Typically, aqueous-based spin printing etchant or modifier compositions are formulated to have a gel-like consistency. Generally, an ink composition is prepared by combining the organic vehicle that is a non-solvent for the ultrahigh molecular weight polymer that is added in powder form, ultrahigh molecular weight polymer and other organic components in a mixing vessel. The composition is then mixed until the ultrahigh molecular weight polymer is wetted by the organic materials. Desirably, care is taken to avoid dirt contamination in the process of preparing the compositions and in preparing parts, since such contamination can lead to defects. Finally, an aqueous solution of the etchant or modifier is added to the wetted ultrahigh molecular weight polymer. The entire mixture is then roller milled under low-shear conditions causing the ultrahigh molecular weight polymer to go into solution and achieving the desired gel-like consistency.

Hydrocarbon-based ink compositions can prepared similarly, but the ultrahigh molecular weight polymers are generally not available in convenient powder forms. Milling of the components can be carried out in the primary solvent rather than in a non-solvent for the ultrahigh molecular weight polymer. Small particles of the ultrahigh molecular weight polymer are added and the mixture is further mixed in a rubber mill for a short period of time while the polymer begins to swell. Mixing is completed in a roller mill.

The temperature of the spin printing process is not critical but will be dependent upon the nature of the solvent being employed. For aqueous systems a temperature range of about 0° C. to about 80° C., preferably 30° C. to 60° C. is convenient. Higher temperatures result in greater evaporation of the dispersing vehicle during the printing process and etching or modification process.

The printing process is not expected to be substantially affected by environmental conditions, though the movement of air between the point the filament is spun and the filament is laid onto the substrate should be minimized.

Relative humidity will affect the drying rate of the aqueous based compositions and have a lesser effect on the other solvent compositions. This is generally reflected in the rate of drying of the polymer filament. If drying is too rapid, the filament can be difficult to elongate prior to laying on the substrate. Drying too rapidly on the substrate can lead to distortions of the edge features of the lines. For these reasons, some control of relative humidity is preferred. It is also useful to utilize bi-component solvents to control the drying profile.

The substrates can be rigid or flexible. Generally, it is desired that the substrates not be highly absorbent and the surface of the substrate clean, free from defects, and smooth.

Rigid substrates include, for example, glass, rigid crystalline or amorphous plastics, glass with various surface treatments, or various electrical components previously printed onto a rigid substrate. Rigid substrates are useful in display devices such as plasma display panels, or liquid crystal displays. Substrates such as crystalline and amorphous silicon for solar energy devices may be printed using the processes disclosed herein.

Flexible or semiflexible substrates can be used for some applications. The substrates includes flexible plastics such as Mylar® poly(ethylene terephthalate), or other polyester films, Kapton® polyimide films, paper, surface-coated paper, polyethylene, polypropylene and biaxially-oriented polypropylene, or other natural and synthetic polymer systems. The printed flexible substrates can be or be incorporated into the final device. Alternatively, the image printed on the flexible substrate can be transferred onto the final device.

Spin-printing is accomplished by spinning the viscoelastic polymer solution containing the etchant or modifier and other components through a die or spinneret onto a substrate that is in motion relative to the spinneret. The solution-spun filament is made-by forcing the solvent containing the polymer and other ingredients through the orifice of the die. The orifice of the die will typically be circular in cross-section, but can also be of other geometries realizing that drawing of a non-circular filament will force it toward a circular cross section. Dies having orifices of varied shape can be utilized to produce filaments having a wide variety of cross sectional designs, for example, round, square, rectangular, or elliptical. For example, a die having a rectangular orifice can be utilized to produce a filament that is essentially in the form of a ribbon or film. If the shape of the filament is other than round, the orientation of the die shape relative to the substrate can be adjusted as desired. For example, a ribbon or rectangular shape can be placed on the substrate either vertically or horizontally, as desired. It is generally convenient to utilize a die having an orifice that is substantially circular. The orifice of such dies will typically have a diameter that is within the range of about 20 to about 400 microns. In most cases, it is preferred for such orifices to have a diameter that is within the range of about 30 microns to about 200 microns.

Spinnerets that are equipped with multiple orifices can be used to print multiple lines in a single pass. Spacing of the multiple holes can be regular to provide a regular array of lines or spaced in a particular pattern to give a particularly desired array of lines. It should be realized however, that there can be considerable die-swell at the exit of the orifice, which is taken into consideration in determining the preferred spacing and placement of the orifices. Dies with multiple holes do not necessarily need to be placed perpendicularly to the direction of printing. A diagonal or offset placement will allow lines to be printed with spacing more narrow than the spacing of holes in the die without having the resulting filaments contact each other close to the orifice as a result of die swell. Holes in the die which are aligned parallel to the printing direction allow multiple thicknesses to be printed in a single pass or to have two or more different compositions printed one atop another in a single pass.

The processes and compositions disclosed herein are useful for the manufacture of a wide range of electronic devices or articles. They can be employed, for example, in the manufacture of display devices such as a plasma display panel, field emission displays, or liquid crystal displays where conductor or phosphors printed by other techniques may require trimming by an etching process but where masking or application of a resist would be inconvenient. Photovoltaic devices such as solar cell panels require ITO conductors to connect the various cells and there are high efficiency designs where is it more convenient to apply ITO to the entire surface and then selectively remove it from certain areas that are generally in long straight lines amenable to the spin printing technique. Other devices in which the processes and compositions can be applicable include electrochemical cells, printed circuits, antennae, shielding devices for electromagnetic radiation, resistance heater devices for automobile windows, electrochromic window devices, microwave circuits, control modules, information storage devices, and EKG electrodes.

The polymer solution containing the etchant or modifier and other ingredients is preferably forced through the die at a rate that is sufficient to attain a spinning speed of about 1 meter per minute to about 1000 meters per minute. Typically, the spinning speed is between about 2 meters per minute to about 400 meters per minute. It is generally desirable to utilize the fastest possible spinning speed that retains satisfactory uniformity. However, it may also be convenient to utilize slower spin-printing speeds to match the speed of the printing process with the speed of subsequent, down-stream steps in the manufacturing process. Higher spinning speeds are also desirable because they result in higher throughputs and better productivity. For this reason, spinning speeds in excess of 400 meters per minute may be desirable if uniformity and other desired properties can be maintained. It is expected that the lower spin-printing speeds can be utilized on rigid substrates where the machine direction is not parallel to the spinning direction.

The etchant or modifier solution is forced through the die or spinneret utilizing an adequate pressure to attain the spinning speed desired. The temperature of the process is below the boiling point of the solvent. The polymer solution will typically be spin-printed at a temperature that is within the range of about 20° C. to about 70° C. when the solvent is water. The temperature will be determined by engineering of the process, the chosen solvent, its rate of evaporation, spinning speeds and other process variables. Temperatures above room temperature and controlled humidity conditions (primarily but not exclusively for aqueous-based systems) are desirable so that a uniform evaporation is easily maintained as atmospheric condition change. It is preferred that much of the solvent is removed from the polymer solution after passage through the die. Judicious choice of organic solvents can allow greater variation of the operating temperatures for the process.

Etchants and modifiers, by their nature are reactive materials. They can react with the ultrahigh molecular weight polymers, potentially degrading the molecular weight and thereby, the viscoelastic properties for the printing methods disclosed herein. This reactivity is a factor in the choice of polymer/etchant combinations. A simple test is to prepare a particular combination in a small vial and assure that the components are thoroughly mixed. A spatula or pipette is inserted into the vial and withdrawn. If a filament forms when the pipette or spatula is withdrawn, then the composition is suitable for printing. If no filament is formed and the contents of the vial are either too liquid from polymer degradation or too viscous from polymer crosslinking, the composition is likely not suitable for printing. This test can be repeated as a function of time to see if the reaction is taking place slowly and whether it would occur in the time frame of the printing process. This test is described for poly(ethylene oxide) and poly(acrylamide) in Example 1 herein below. The ultrahigh molecular weight polymer and the dispersing vehicle can be considered to be chemically stable to the etchant or modifier if the viscoelasticity if maintained for a period of time sufficient to accomplish the printing process.

It should be noted that etching and modification are stoichiometric reactions requiring quantities of reagent greater than some minimal value to be able to go to completion. In the examples below, there are instances where wider lines are etched completely so there is no conductivity, but thinner lines are not. The volume of etchant in a particular filament will be proportional to the square of the radius while the width of the line will be proportional to the radius. Thus, as lines become thinner, the volume of etchant applied in a single filament is falling off as the square. Additionally, the thickness of the material being etched can be varied. A thicker layer of material will require a greater quantity of etchant to be completely penetrated than a thinner layer. Thus, in the examples below, failure to completely penetrate a given surface layer is not an indication of a failed experiment. Rather, it is an example of providing less etchant to the site than was required to achieve full penetration, while etching did in fact occur. Complete etching of thicker layers or thinner lines can be accomplished by sequentially printing more than one pass of etchant filament across the same location. If the filament is the same diameter, a second pass would double the quantity of etchant delivered to that location, thereby doubling the depth of the etching reaction. Multiple pass printing can be carried out as many times as is required to accomplish the level of etching required for the application.

EXAMPLES

This invention is illustrated by the following examples that are merely for the purpose of illustration and are not to be regarded as limiting the scope of the invention or the manner in which it can be practiced.

Example 1

Preparation of Etchant Solutions

Ultrahigh molecular weight polymers (200 mg portions giving 2% solutions) were added to 10 mL solutions of acid or base in distilled water and vortexed on a mini vortexer (VWR, West Chester, Pa.) for several minutes before rolling overnight on a U.S. Stoneware (East Palestine, Ohio) roll mill. This resulted in clear, colorless solutions, but in some cases the viscoelasticity of the solution was insufficient for spinning as indicated by inserting a glass pipette into the resulting liquid and withdrawing it quickly to observe whether the withdrawal caused a filament to be formed. The polymers utilized were poly(acrylamide) (PAA, 200 mg, Mw=18,000,000, Polysciences, Inc., Warrington, Pa.) and poly(ethylene oxide) (PEO, 200 mg, Mw=5,000,000, Aldrich, Milwaukee, Wis.). The acids and bases were by weight 10 wt % NaOH, 20 wt % NaOH, 10 wt % HCl, 10 wt % $H_2SO_4$. The results in Table 1 summarize the viscoelastic properties of the solutions.

TABLE 1

Viscoelastic properties of various potential etchant systems.

| Aqueous Etchant system | Polymer | |
|---|---|---|
| | PAA | PEO |
| 10 wt % NaOH | viscoelastic | non-viscoelastic, white solids |
| 20 wt % NaOH | viscoelastic | non-viscoelastic, white solids |
| 10 wt % HCl | moderately viscoelastic, white solids | viscoelastic |
| 10 wt % $H_2SO_4$ | slightly viscoelastic, white solids | viscoelastic |
| 10 wt % $HNO_3$ | | viscoelastic |
| 17 wt % sulfamic acid | | viscoelastic |
| 3:3:1:1 $H_3PO_4$:$HNO_3$:$CH_3CO_2H$:$H_2O$ | | viscoelastic |
| 3:3:23:1 $H_3PO_4$:$HNO_3$:$CH_3CO_2H$:$H_2O$ | | viscoelastic |
| 4:1:40 KI:$I_2$:$H_2O$ | viscoelastic | non-viscoelastic |
| 5:20:75 CuCl:$NH_4Cl$:$H_2O$ | | viscoelastic |

Thus, polyacrylamide solutions work best in basic etchants while polyethyleneoxide solutions work best in acidic etchants.

Example 2

Etching Aluminum With Base Using Spin Printing

A CS-194T BioDot XYZ Dispense Platform from Cartesian Technologies (Genomic Solutions, Inc., Ann Arbor, Mich.) was modified for spin printing. The BioDot programming allowed for the use of multiple onboard syringe pumps coordinated with the moveable stage. The BioDot XYZ Dispense Platform utilizes a variable speed 250 μL syringe pump correlated to a moveable platform of maximum speed ca. 2.6 m/min. Custom-made spin jet heads were cut to length from ART[10] Molecular BioProducts pipette tips #2139 (VWR Scientific, West Chester, Pa.) with an exit internal diameter of ca. 45 μm. These jet heads are the equivalent to spinnerets in traditional fiber spinning.

An $O_2$ plasma cleaned 51 mm square glass slide with 1.5 mm thickness was coated in aluminum with a Balzers MED 010 Evaporator using a tungsten filament. After wrapping the filament with Al foil, evaporation of Al began on the glass at a 10 Å/s rate under a $10^{-4}$ mbar vacuum. The evaporation was completed after coating a layer of aluminum that was 0.1 μm thick.

The injector syringe of the Biodot system was filled manually with the 20% aqueous NaOH in PAA prepared in Example 1. The etching solution was too viscous to be filled under the suction of the pump. The syringe pump exhibited no problems in pushing this solution through the jet. The BioDot AxSys software was programmed to initiate a line off one side of the slide and draw it beyond the other side of the slide. This line was drawn across the aluminum coated glass slide at <1 mm from the surface of the slide as to minimize any drawing effects due to gravity.

After a single line was drawn with the etching solution across the entire length of the Al coated glass slide, it was allowed to stand and then rinsed with water. Conductivity was tested using a simple voltmeter while placing the probes on either side of the line. The voltmeter showed no conductivity across the line, indicating complete etching of the aluminum between the halves of the coated glass slide. The etched line or gap viewed under a microscope was straight and the width of the gap varied between 100 µm-200 µm.

Example 3

Acid Etching of Aluminum

Using the printing method of Example 2, a solution of 3:3:1:1 $H_3PO_4:HNO_3:CH_3CO_2H:H_2O$ containing 2% PEO of (Mw=5,000,000, Aldrich, Milwaukee, Wis.) was spin printed onto an aluminum coated glass slide (Al coating of 0.1 µm). Lines more narrow than 100 microns in width did not etch sufficient material to break the conductivity between the two sides of the slide, but light did pass through most portions of the etched line. Printed lines 100 microns and greater did eliminate conductivity. For a 400 µm line, the etching process was sufficient to eliminate conductivity within in about 5 minutes.

Observation of the etching solution after two weeks indicated that the ultrahigh molecular weight polymers had been degraded and that spinning was no longer possible, indicating that the shelf life of the etchant solutions is not indefinite.

Example 4

Acid Etching of Aluminum

Using the printing method of Example 2, a solution of 3:3:23:1 $H_3PO_4:HNO_3:CH_3CO_2H:H_2O$ containing 2% PEO of (Mw=5,000,000, Aldrich, Milwaukee, Wis.) was spin printed onto an aluminum coated glass slide (Al coating of 0.1 µm). Lines more narrow than 100 microns in width did not etch sufficient material to break the conductivity between the two sides of the slide, but light did pass through most portions of the etched line. Printed lines 100 microns and greater did eliminate conductivity. For a 400 µm line, the etching process was sufficient to eliminate conductivity within in about 8 minutes.

Observation of the etching solution after two weeks indicated that the ultrahigh molecular weight polymers had been degraded and that spinning was no longer possible indicated that the shelf life of the etchant solutions is not indefinite.

Example 5

Spin Printing Sodium Thioglycolate Etchant

A saturated solution of sodium thioglycolate (Aldrich Chemical, 5 mL) in water was prepared by stirring with an excess of sodium thioglycolate and then decantation from the solids. A sample of UHMW polyethyleneoxide (Aldrich 18,947-2, molecular weight about 5,000,000, 1 g) was dispersed quickly into highly stirred hot water 50 mL) in a jar. The jar containing the UHMW PEO and water was placed onto a roller mill (US Stoneware) set on its lowest speed. Tumbling overnight produced a viscous, relatively homogeneous liquid or gel. One mL of the polymer solution was added to the thioglycolate solution in a 25 mL sample vial. The capped sample vial was then placed in a jar with padding and placed on the roller mill at its slowest speed for 24 hours.

An $O_2$ plasma-cleaned 51 mm square glass slide 1.5 mm thick was coated with nickel or copper using a Balzers MED 010 Evaporator and a tungsten filament. The copper coating was 0.1 µm and the nickel coatings were 0.1 and 0.5 µm.

The polymer-modified thioglycolate solution was then transferred to a spin printer. Lines of the solution were drawn across glass slides that had been sputter-coated with copper and nickel films. The thicker lines were able to etch completely through the copper and nickel films. Measurement of the conductivity of the film across the line with a BK Toolkit 2703B volt/ohm Multimeter (B&K Precision Corporation, Yorba Linda, Calif.) indicated that there was no conductivity and etching was complete for both Ni samples and the Cu sample. The medium lines were able to penetrate the thin coatings but not the 0.5 µm nickel as confirmed by no conductivity across the Cu, but continuity across the thicker Ni sample. The finest lines contained insufficient etchant to etch completely through the surface layer and there was electrical continuity in both Ni and Cu, but it could be observed that some incomplete etching had occurred. Again, this is a matter of the quantity of etchant available for a given thickness of material to be etched.

Example 6

Spin Printing Sodium Thiosulfate Etchant

A saturated solution of sodium thiosulfate (Aldrich Chemical, 5 mL) in water was prepared by stirring with an excess of sodium thioglycolate and then decantation from the solids. One mL of the UHMW polyethyleneoxide solution prepared in E110376-22 was added to the thiosulfate solution in a 25 mL sample vial. The capped sample vial was then placed in a jar with padding and placed on the roller mill at its slowest speed for 24 hours.

The polymer-modified thiosulfate solution was then transferred to the spin printer. Lines of the solution were drawn across glass slides that had been sputter-coated with a copper film. The thicker lines were able to etch completely through the copper film. Measurement of the conductivity of the film across the line with the Multimeter indicated that there was no conductivity and etching was complete. The medium lines were also able to penetrate the copper. The finest lines contained insufficient etchant to etch completely through the copper surface layer, but it could be seen that some incomplete etching had occurred.

What is claimed is

1. A process comprising:
   a) forcing a deposit composition comprising from 0.1 to 50 percent by weight of at least one of an etchant or modifier, a dispersing vehicle, wherein the dispersing vehicle is at least about 80 weight/volume percent water, and from 0.1 to 8 percent by weight, based on the total weight of the deposit composition, of an ultrahigh molecular weight viscoelastic polymer selected from the group consisting of poly(ethylene oxide), poly(acrylamide),[acrylamide-3-(2-acrylamido-2-methylpropyl) dimethylammonio)-1-propanesulfonate copolymer], and having a molecular weight greater than 1,000,000 dissolved in the dispersing vehicle, the ultrahigh molecular weight polymer and the dispersing vehicle both being chemically stable to the etchant or modifier, through an orifice to form a continuous filament, b) drawing the continuous filament to a draw ratio between 2:1 and 100:1;

c) depositing the continuous filament onto a surface layer on a substrate in an image-wise manner;

d) allowing the etchant or modifier in the deposited continuous filament to react with the surface layer on the substrate, thereby removing or otherwise modifying the physical properties of the surface layer in the desired image.

2. The process of claim 1 further comprising washing the surface of the substrate.

3. The process of claim 1 wherein steps a), b) and c) are carried out substantially simultaneously and continuously.

4. The process of claim 1 wherein the weight fraction of the etchant or modifier is from 0.5 to 30 percent of the deposit composition.

5. The process of claim 1 in which two or more adjacent lines are printed onto the substrate in contact with one other.

6. The process of claim 1 wherein the deposit composition is heated to a temperature that is higher than that of the substrate.

7. The process of claim 1 wherein the surface of the substrate is heated to a temperature that is higher than that of the deposit composition.

8. The process of claim 1 wherein the surface layer is selected from metals or ITO.

9. The process of claim 1 wherein the surface layer is a semiconductor.

10. The process of claim 1 further comprising touching the orifice to the substrate to establish adhesion between the filament and the substrate.

11. The process of claim 1 further comprising modulating the width of the image by modulating the draw ratio of the filament.

12. The process of claim 1 wherein the etchant is a strong acid or strong base.

13. The process of claim 1 wherein the etchant comprises a mixture of phosphoric acid, nitric acid, acetic acid and water.

14. The process of claim 1 wherein the etchant is combined with the ultrahigh molecular weight polymer solution in the dispersing vehicle immediately prior to said forcing the deposit composition through the orifice to form a filament.

15. A process comprising:

a) depositing from a dispensing orifice a reservoir of a deposit composition comprising from 0.1 to 50 percent by weight of at least one of an etchant or modifier, a dispersing vehicle, wherein the dispersing vehicle is at least about 80 weight/volume percent water, and from 0.1 to 8 percent by weight of an ultrahigh molecular weight viscoelastic polymer selected from the group consisting of poly(ethylene oxide), poly(acrylamide), [acrylamide-3-(2-acrylamido -2-methylpropyl)dimethylammonio)-1-propanesulfonate copolymer], and having a molecular weight greater than 1,000,000 and being soluble in that dispersing vehicle, the ultrahigh molecular weight polymer and the dispersing vehicle both being chemically stable to the etchant or modifier, onto the surface of a substrate, such that said dispensing orifice and said substrate are simultaneously wet by the material in said reservoir;

b) pulling a filament from said reservoir by removing the dispensing orifice from the reservoir and translating the dispensing orifice in a direction away from the surface of said substrate to a location above a second point on said substrate at least 1 cm removed from the initial reservoir such that said filament extends between said reservoir and said location above that second point;

c) depositing that filament between said reservoir and said second point on the substrate by contacting the dispensing orifice to the substrate at said second point in an image-wise manner;

d) allowing the etchant or modifier in the deposited filament to react with the substrate surface, thereby removing or otherwise modifying the physical properties of the substrate surface in the desired image.

* * * * *